United States Patent [19]

Ogawa et al.

[11] Patent Number: 4,506,434
[45] Date of Patent: Mar. 26, 1985

[54] METHOD FOR PRODUCTION OF SEMICONDUCTOR DEVICES

[75] Inventors: Tetsuya Ogawa, Machida; Nobuo Toyokura, Kawasaki, both of Japan

[73] Assignee: Fujitsu Limited, Kawasaki, Japan

[21] Appl. No.: 414,803

[22] Filed: Sep. 3, 1982

[30] Foreign Application Priority Data

Sep. 10, 1981 [JP] Japan ................. 56-142911

[51] Int. Cl.³ ............... H01L 21/76; H01L 21/302; H01L 21/20
[52] U.S. Cl. .................... 29/571; 29/578; 29/576 W; 148/1.5; 148/175; 148/187; 156/643; 156/648; 156/662; 357/49
[58] Field of Search ............... 29/571, 576 R, 576 B, 29/576 W, 578; 148/174, 175, 187, 1.5; 357/47, 48, 49, 50; 156/643, 648, 653, 661.1, 662

[56] References Cited

U.S. PATENT DOCUMENTS

| | | | |
|---|---|---|---|
| 3,421,055 | 1/1969 | Bean et al. | 156/648 X |
| 3,719,535 | 3/1973 | Zoroglu | 148/187 |
| 4,104,086 | 8/1978 | Bondur et al. | 29/576 W X |
| 4,192,059 | 3/1980 | Khan et al. | 29/571 |
| 4,209,349 | 1/1980 | Ho et al. | 148/174 X |
| 4,209,350 | 6/1980 | Ho et al. | 148/1.5 X |
| 4,252,582 | 2/1981 | Anantha et al. | 29/578 X |
| 4,261,763 | 4/1981 | Kumar et al. | 29/576 W X |
| 4,385,433 | 5/1983 | Ozawa | 29/571 X |
| 4,391,650 | 7/1983 | Pfeifer et al. | 29/571 X |

FOREIGN PATENT DOCUMENTS

| | | | |
|---|---|---|---|
| 3023410 | 1/1982 | Fed. Rep. of Germany . | |
| 2174 | 1/1977 | Japan | 156/661.1 |
| 51872 | 4/1977 | Japan | 156/653 |

OTHER PUBLICATIONS

IBM Technical Disclosure Bulletin, vol. 23, No. 8, Jan. 1981, New York, D. W. Ormond, pp. 3694–3697.
IBM Technical Disclosure Bulletin, vol. 21, No. 7, Dec. 1978, New York, H. B. Pogge, pp. 2734–2735.
IBM Technical Disclosure Bulletin, Abbas et al., "Simplified Isolation for an Integrated Circuit", vol. 25, No. 12, May 1983, pp. 6611–6614.

Primary Examiner—Brian E. Hearn
Assistant Examiner—David A. Hey
Attorney, Agent, or Firm—Armstrong, Nikaido, Marmelstein & Kubovcik

[57] ABSTRACT

A method for producing semiconductor devices having a substrate, element fabrication areas formed in the substrate and isolation areas surrounding the element fabrication areas. The method comprises forming a thermal strain absorbing layer on the top surface of the element fabrication areas, forming at least one groove in an area which is to become the isolation areas, inlaying an insulator in the at least one groove, and annealing the insulator to make the density thereof uniform.

9 Claims, 21 Drawing Figures

METHOD FOR PRODUCTION OF SEMICONDUCTOR DEVICES

BACKGROUND OF THE INVENTION

1. Field of the Invention

The present invention relates to methods for production of semiconductor devices, and more specifically to an improvement applicable to methods for production of buried insulating layers each of which surrounds a portion of a semiconductor substrate in which elements are fabricated, the buried insulating layers functioning to isolate from one another, each element fabricated in a chip.

2. Description of the Prior Art

There is now a tendency in which the dimensions of each element is decreased in order to satisfy requirements for a larger quantity of elements fabricated in a chip and also for a larger quantity of elements fabricated in the unit area of a chip. Such requirements are included in the requirements effective to satisfy the ultimate purposes for development of LSI's and further of VLSI's. Insofar as the processes for isolating each element fabricated in one chip from one another are concerned, a process which is called local oxidation of silicon is available, and it is well known that this process has various advantages in the aspects of easy production of durable wiring which is free from potential discontinuation thereof and the potential employment of self-alignment and the like. However, this local oxidation process has drawbacks. The first is the problem of bird's beak. Referring to FIG. 1, local oxidation of the top surface of a silicon (Si) substrate 11, having a limited area covered by a silicon nitride ($Si_3N_4$) layer mask 12, is accompanied by lateral growth of a silicon dioxide ($SiO_2$) layer 13. This lateral growth produces a silicon dioxide ($SiO_2$) layer having a bird's beak shape which extends under the silicon nitride ($Si_3N_4$) layer 12. The lateral length A of this bird's beak causes a degradation of dimensional accuracy. The second is the problem of strain which is produced in the portion B of the silicon substrate 11. The portion B directly contacts the layer 13 of silicon dioxide ($SiO_2$) which is converted from silicon (Si) during the oxidation process which inevitably causes expansion in volume of the nitride. This strain, appearing in the silicon (Si) layer B, can cause unsatisfactory characteristics in elements fabricated in the silicon (Si) layer. The third is the problem of white ribbon. Since it is not easy to completely remove the silicon nitride ($Si_3N_4$) layer 12, numerous minute particles of the nitride remain on the surface of the silicon (Si) substrate 11 in the form of scattered stains. These residual nitride particles function as a type of mask during oxidation processes carried out in later steps.

The above process results in a local oxidation process which is not necessarily satisfactory for the production of a semiconductor device having minute patterns. To overcome the foregoing drawbacks, a method wherein each element is isolated from one another by buried insulating layers which are grown to fill grooves produced along the surface of a silicon (Si) substrate to surround each element, has been developed and is presently being used. Unfortunately, however, this improved method has other drawbacks described below, with reference to the drawings.

Depending on the etching process employed, this improved prior art method is classified into two independent categories.

The first is the case wherein a dry etching process is employed. Referring to FIG. 2(a), the first step is to employ a chemical vapor deposition process for the purpose of growing an insulating layer 22 on a silicon (Si) substrate 21 which is provided with grooves 23 surrounding mesa shaped portions 24 in which elements are to be fabricated, before a photoresist layer 25 is coated on the uneven surface of the insulating layer 22. As a result, the top surface of the photoresist layer 25 becomes flat. Referring to FIG. 2(b), the second step is to employ a dry etching process which has a single etching rate regardless of the quality of the material to be etched, to the substrate 21 covered by the insulating layer 22 and by the photoresist layer 25. As a result, the insulating layer 22 remains only in the groove 23, and the top surface of the silicon (Si) substrate 21 becomes uncovered. During this process, however, the ion beams employed for the dry etching process readily produce damaged areas C along the top surface of the mesa shaped portion 24 of the silicon (Si) substrate 21 in which elements are to be fabricated. These damaged areas can cause unsatisfactory characteristics for elements fabricated in the substrate 21. It is quite natural that the silicon (Si) substrate must be exposed to a plurality of high temperature processes such as oxidation and annealing for repairing the damage caused by application of ion implantation processes and the like, during later processes for production of elements therein. Referring to FIG. 2(c), since the foregoing high temperature processes are involved with non-uniform variation of density of the insulating layer 22, this variation causes strains $E_1$ and/or $E_2$ to occur at the corners of the mesa shaped portion 24 of the substrate 21 surrounded by the buried insulating layer 22. These strains are also parameters for causing unsatisfactory characteristics for elements fabricated in the substrate 21.

The second is the case wherein a wet etching process is employed. Referring to FIG. 2(d), the first step is to employ a dry etching process to remove the photoresist layer 25 from the areas on which elements are to be fabricated, leaving the photoresist layer 25 only along the grooves. Referring to FIG. 2(e), the second step is to employ a wet etching process to remove the insulating layer 22 from the areas on which elements are to be fabricated, leaving the insulating layer 22 only in the grooves 23. Since the grooves 23 have sharp corners at the bottom and top edges, the density of the insulating layer 22 is not entirely uniform and the density thereof is less along the broken lines shown in each of FIGS. 2(a), 2(b), 2(d) and 2(e) than in the other regions. Since a material having a lower density has a larger etching rate, recesses D are produced along the edges of the insulating layers 22 which are buried in the silicon (Si) substrate 21. As a result, the surface of a chip is not flat, causing the possibility of discontinuity and/or dimensional errors for wires which are placed along the silicon (Si) substrate 21.

To prevent occurrence of the foregoing recesses D along the edges of the insulating layer 22, an annealing process is ordinarily employed after the completion of the insulating layer 22. Albeit this annealing process is effective to unify or make uniform the density of the insulating layer 22 even in the portions along the broken lines shown in FIG. 2, differences in the amount of the coefficient of expansion between the material of the substrate and the material of the insulating layer causes stresses to occur along the interfaces of both materials, since the stresses are concentrated along the edges. As a result, strains $E_1$ and/or $E_2$ occur along the edges of the element fabrication areas of the substrate 21 surrounded by the buried insulating layer 22 in FIG. 2(f). These strains are also parameters for causing unsatisfactory characteristics for elements fabricated in the substrate 21.

SUMMARY OF THE INVENTION

An object of the present invention is to provide a method for producing a semiconductor device having a plurality of elements each of which is isolated from one another by buried insulating layers, wherein an improvement is made (a) to prevent strains $E_1$ which may otherwise occur along the top edges of the element fabrication areas of the semiconductor substrate surrounded by buried insulating layers which function to isolate each element from one another, from occurring during an annealing process which is carried out to unify the density of the insulating layer, (b) to decrease the amount of strains $E_2$ which occur along the bottom edges of the element fabrication areas of the semiconductor substrate surrounded by buried insulating layers which function to isolate each element from one another during the annealing process which is carried out to unify the density of the insulating layer and (c) to prevent damaged areas C which may otherwise be produced along the element fabrication areas of a semiconductor substrate surrounded by buried insulating layers, from being produced during a dry etching process which is carried out to remove a part of the insulating layer which is grown on the semiconductor substrate leaving the other part of the insulating layer in grooves surrounding the element fabrication areas of the semiconductor substrate, the remaining part of the insulating layer being the buried insulating layer which functions as an isolation region.

The other object of the present invention is to provide a method for production of a semiconductor device having a plurality of elements each of which has satisfactory quality due to lack of damage in the element fabrication areas of the semiconductor substrate surrounded by buried insulating layers which function to isolate each element from one another, wherein an improvement is made to simplify the steps for production of wiring.

To achieve the foregoing first object, a method for production of a semiconductor device in accordance with the present invention comprises a step of growing a thermal strain absorbing layer on at least a portion of the top surface of a semiconductor substrate, the portion being an area which is not an area which becomes an isolation area, a step of producing at least one groove along said area which becomes an isolation area, a step of inlaying an insulator in said at least one groove, and a step of annealing said insulator.

The concept of the present invention is to interleave a thermal strain absorbing layer between the top surface of a semiconductor substrate and an insulating layer, of which a part is to become a buried insulating layer, for the purpose of allowing the thermal strain absorbing layer to absorb strains which may otherwise occur due to an annealing process and to prevent damage which may otherwise be produced by irradiation of ion beams.

FIG. 3 shows the cross-sectional view of a semiconductor device produced employing a method for production of a semiconductor device in accordance with the present invention. Since a thermal strain absorbing layer 32 is interleaved between the top surface of a semiconductor substrate 31 and an insulator layer 33 except for the area which is to become a buried insulating layer, strains $E_1$ occur along the edges of the thermal strain absorbing layer 32 rather than along the top edges of the element fabrication areas of the semiconductor substrate 31, during an annealing process which is carried out to make uniform the density of the insulating layer 33. During a dry etching process which is carried out to remove a portion of the insulating layer 33, damaged areas G are produced in the thermal strain absorbing layer 32 rather than in the semiconductor substrate 31. As a result, the portions of the semiconductor substrate 31 in which elements are to be produced are protected from potential strains and damage, thereby enabling the characteristics of the elements to be enhanced. Since the strains $E_1$ do not occur in the semiconductor substrate 31 and since the magnitude of stress which may cause strains $E_2$ is limited, the amount of strains $E_2$ which occurs along the bottom edges of the element fabrication areas 34 of the semiconductor substrate surrounded by the buried insulating layers is also decreased.

The requirements for the thermal strain absorbing layer are (a) that the material will have to be chemically stable under an annealing temperature of approximately 900° C. or higher and (b) that the material readily absorbs strains. Exemplary materials satisfying these requirements are polycrystalline silicon (Si), molybdenum silicide ($MoSi_2$), tungsten silicide ($WSi_2$), titanium silicide ($TiSi_2$) and tantalum silicide ($TaSi_2$).

Silicon dioxide ($SiO_2$), silicon nitride ($Si_3N_4$) and aluminum oxide ($Al_2O_3$) can be selected as the material of the buried insulating layer.

Not only silicon (Si) but also any of the compound semiconductors including galium-arsenic (GaAs), indium-phosphorus (InP) et al can be selected as the material of the semiconductor substrate.

To achieve the foregoing second object, a method for production of a semiconductor device in accordance with the other embodiment of the present invention comprises, in addition to the steps specified above for the method for production of a semiconductor device in accordance with the present invention, a step to produce a conductive layer on the thermal strain absorbing layer and on the buried insulating layer and a step to pattern the conductive layer to a shape corresponding to the gate electrode and some of the conductive wires.

Materials selected as a material for the conductive layer are molybdenum silicide ($MoSi_2$), tungsten silicide ($WSi_2$), titanium silicide ($TiSi_2$), tantalum silicide ($TaSi_2$) and polycrystalline silicon (Si).

BRIEF DESCRIPTION OF THE DRAWINGS

The present invention, together with its various features and advantages, can be readily understood from the following more detailed description presented in conjunction with the following drawings.

FIGS. 4(a), 4(b), 4(c), 4(d) and 4(e) are cross-sectional views of silicon (Si) substrates, each of which shows the state after the completion of each of the major steps of a method for production of a semiconductor device in accordance with one embodiment of the present invention.

DETAILED DESCRIPTION OF THE PREFERRED EMBODIMENTS

In the following description, one of each embodiment in accordance with the present invention will be presented, on the assumption that FET's are produced in a silicon substrate, such FET's being isolated from one another by buried insulating layers each of which surrounds each of the FET-s.

The first embodiment is a method for production of a semiconductor device having a plurality of FET's, each of which is fabricated in an element fabrication area of a silicon (Si) substrate surrounded by a buried insulating layer, wherein an improvement is realized in which a thermal strain absorbing layer of polycrystalline silicon (Si) is interleaved between the substrate and the insulating layer such that the polycrystalline silicon (Si) layer absorbs potential strains and damage which may otherwise occur in the silicon (Si) substrate. This embodiment will be presented, referring to FIGS. 4(a), 4(b), 4(c), 4(d) and 4(e).

Figure 1:
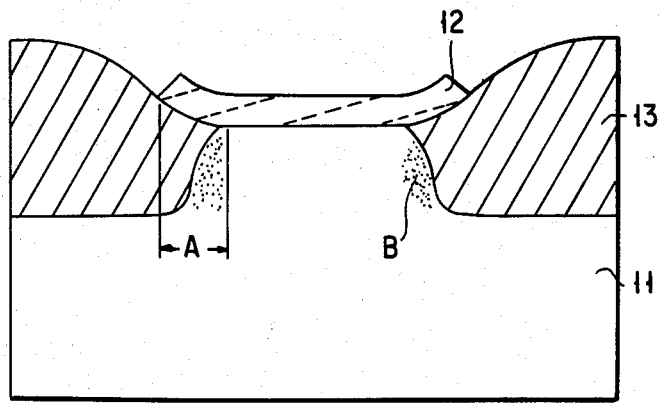
FIG. 1 is a cross-sectional view of a silicon (Si) substrate showing the position after the completion of a prior art local oxidation process.
Figure 2A:
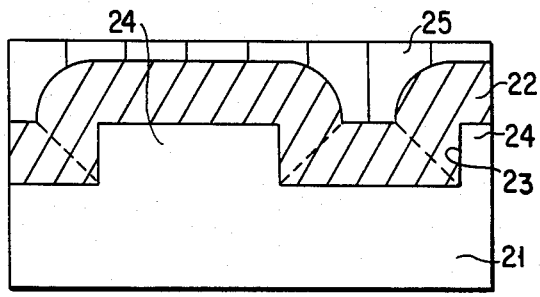
FIGS. 2(a), 2(b), 2(c), 2(d), 2(e) and 2(f) are cross-sectional views of silicon (Si) substrates, each of which shows the state after the completion of each of the major steps of a method for production of a buried insulating layer which functions as isolation, according to the prior art.
Figure 2B:
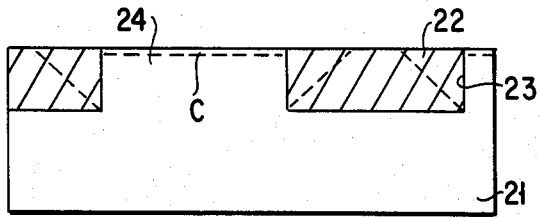
Figure 2C:
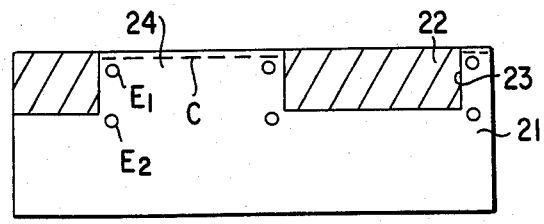
Figure 2D:
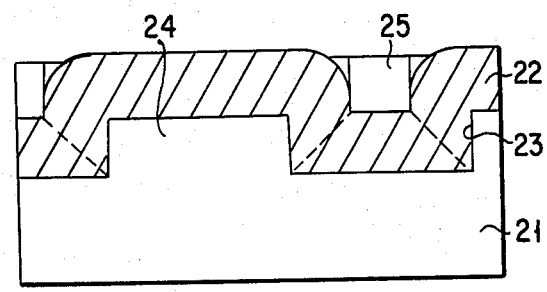
Figure 2E:
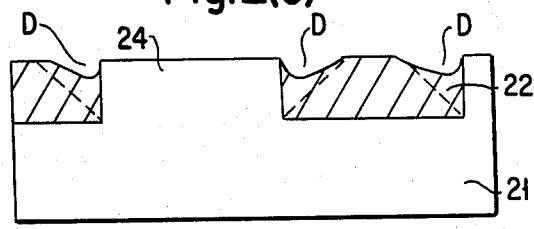
Figure 2F:
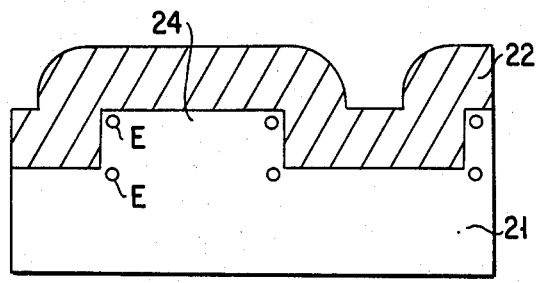
Figure 3:
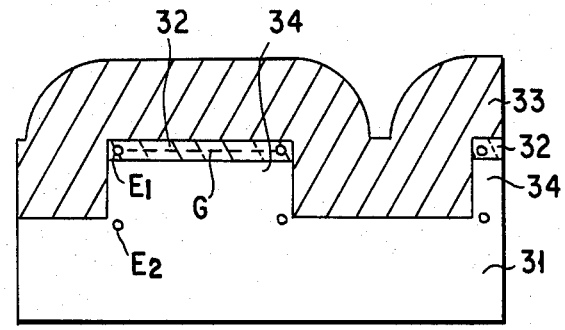
FIG. 3 is a cross-sectional view of a semiconductor device produced employing a method for production of a semiconductor device in accordance with the present invention.
Figure 4A:
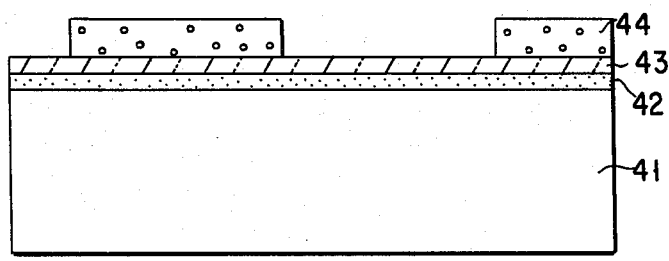

Referring to FIG. 4(a), the top surface of a silicon (Si) substrate 41 is oxidized to produce a silicon dioxide (SiO$_2$) layer 42 having a thickness of 500 Å, before a polycrystalline silicon (Si) layer 43 having a thickness of 1,000 Å is grown on the silicon dioxide (SiO$_2$) layer 42. The function of the silicon dioxide (SiO$_2$) layer 42 is to make it easy to remove the polycrystalline silicon (Si) layer 43 in a later step. In other words, it functions to solve the difficulty in removing the polycrystalline silicon (Si) layer 43 when it is produced directly on the silicon (Si) substrate 41, which is, of course, a material identical to the layer. The function of the polycrystalline silicon (Si) layer 43 is to absorb, strain and damage. Therefore, this layer 43 can be replaced by a molybdenum silicide (MoSi$_2$) layer, a tungsten silicide (WSi$_2$) layer, a titanium silicide (TiSi$_2$) layer, a tantalum silicide (TaSi$_2$) layer or the like, insofar as the annealing temperature range is 900° through 1,100° C. This is because these materials are stable from the chemical viewpoint in the foregoing temperature range and readily absorb strains. A photoresist layer 44 is produced on the surface of polycrystalline silicon (Si) layer 43, before a patterning process is applied to the photoresist layer 44 for the purpose of producing grooves along the area corresponding to the area in which a buried insulating layer is produced. A thickness of the layer 43 is thicker than 500 Å for absorb.

Figure 4B:
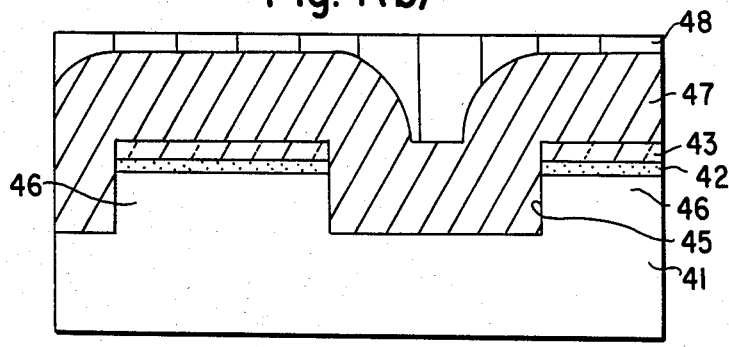

Referring to FIG. 4(b), the patterned photoresist layer 44 functions as a mask during a parallel plate type reactive ion etching process applied to the substrate for the purpose of partly removing the polycrystalline silicon (Si) layer 43, the silicon (Si) substrate 41 for the ultimate purpose to produce grooves 45 having the depth of 6,500 Å in the silicon (Si) substrate 41. A carbon fluoride (CF$_4$) gas containing oxygen (O$_2$) by 5% is employed as the reactive gas and an etching rate of 200 Å/min. is realized at a pressure of $5 \times 10^{-3}$ Torr. After the photoresist layer 44 is entirely removed, a low pressure chemical vapor deposition process is employed to grow a silicon dioxide (SiO$_2$) layer 47 having a thickness of 8,000 Å which entirely covers the top surface of the substrate 41. Thereafter, the substrate is subjected to an annealing process for 20 minutes in the nitrogen (N$_2$) gas at a temperature of 1,000° C. for the purpose of unifying or making uniform the density of the silicon dioxide (SiO$_2$) layer 47. Albeit strains may occur in the polycrystalline silicon (Si) layer 43 during this process, the entire portion of the silicon (Si) substrate 41 is maintained free from strains. In other words, potential strains which might otherwise occur along the edges of the element fabrication area 46 of the silicon (Si) substrate 41 surrounded by the buried insulating layer 47, are absorbed by the polycrystalline silicon (Si) layer 43. The top surface of the silicon dioxide (SiO$_2$) layer 47 is coated by a photoresist layer 48 of e.g. AZ1350J produced and marketed by Shipley Company Inc. of the U.S.A. and the top surface of the photoresist layer 48 becomes flat.

Figure 4C:
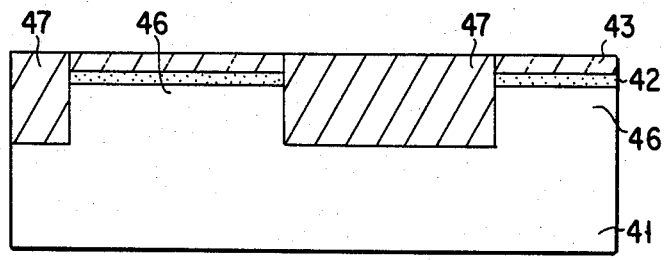
Figure 4C:
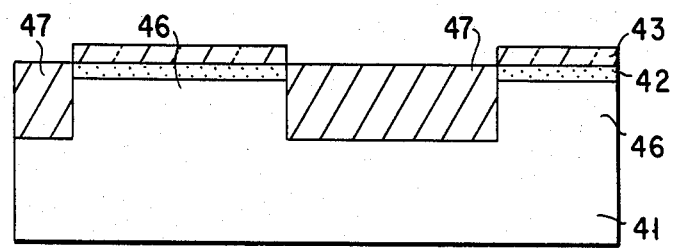
Figure 4C:
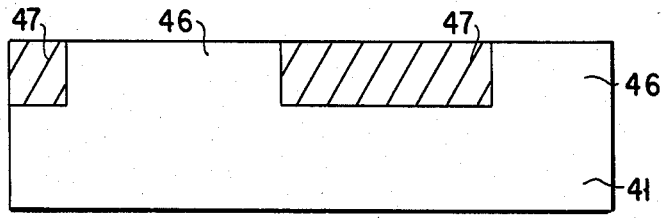

Referring to FIG. 4(c), a dry etching process is applied to the substrate until the top surface of the polycrystalline silicon (Si) layer 43 is exposed. An argon (Ar) gas at a pressure of $7 \times 10^{-4}$ Torr. is employed and an etching rate of 500 Å/min. is realized. Although damage may occur in the polycrystalline silicon (Si) layer 43, during this process, the entire silicon (Si) substrate 41 is protected from damage. This means that potential damages which might be otherwise be produced along the edges of the element fabrication area 46 of the silicon (Si) substrate 41 surrounded by the buried insulating layer 47, are absorbed by the polycrystalline silicon (Si) layer 43.

Referring to FIG. 4(d), a dry etching process is applied to the substrate to remove only the upper portion of the silicon dioxide (SiO$_2$) layer 47 by a depth corresponding to the thickness of the polycrystalline silicon (Si) layer 43. A trifluoromethane (CHF$_3$) gas at a pressure of 0.05 Torr. is employed and an etching rate of 800 Å/min. is realized.

Referring to FIG. 4(e), a plasma etching process employing a carbon fluoride (CF$_4$) gas containing 5% of oxygen ($O_2$) at a pressure of 1 (one) Torr. is applied to the substrate to remove the polycrystalline silicon (Si) layer 43 at an etching rate of 500 Å/min. Thereafter, a hydrogen fluoride (HF) solution is brought into contact with the surface of the substrate to remove the silicon dioxide ($SiO_2$) layer 42 and the top portion of the silicon dioxide ($SiO_2$) layer 47, thereby exposing the top surface of the silicon (Si) substrate 41. As a result, a portion of the silicon dioxide ($SiO_2$) layer 47 remains buried surrounding the element fabrication area 46 of the silicon (Si) substrate 41 and the buried silicon dioxide ($SiO_2$) layer 47 functions as an isolation region.

The foregoing description has described a method for production of a semiconductor device having a plurality of FET's, each of which is fabricated in an element fabrication area of a silicon (Si) substrate surrounded by a buried insulating layer which functions as an isolation, wherein improvements are realized which prevent strains from occurring at the corners of the element fabrication area of the silicon (Si) substrate surrounded by the buried insulating layer and which prevent damage on the surface of the element fabrication area of the silicon (Si) substrate surrounded by the buried insulating layer when a high temperature process, which is carried out to unify the density of the insulating layer and to prohibit the dry etching process which is carried out to remove the insulating layer from the area except for the buried insulating layer. As a result, in accordance with the present invention, it is possible to produce a semiconductor device having a high quality.

The second embodiment, which is an extension of the previous embodiment, is a method for production of a semiconductor device in accordance with the first embodiment, wherein the polycrystalline silicon (Si) layer, which functions to absorb thermal strains, is further employed for production of electrodes for gates and/or some of the metal wiring. This simplifies the production steps thereof. This embodiment will be described, referring to FIGS. 5(a), 5(b) and 5(c).

The steps described below will follow the step of the foregoing embodiment presented with reference to FIG. 4(c).

Figure 5A:
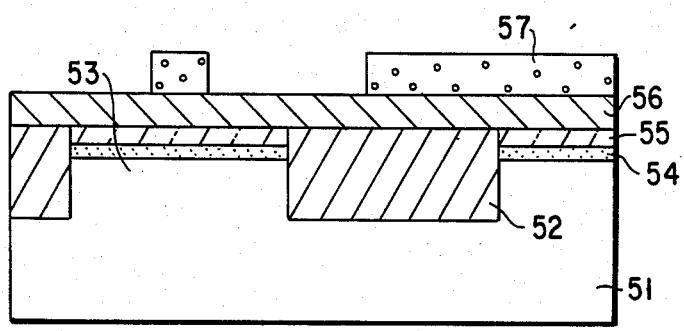
FIGS. 5(a), 5(b) and 5(c) are cross-sectional views of silicon (Si) substrates, each of which shows the state after the completion of each of the major steps of a method for production of a semiconductor device in accordance with another embodiment of the present invention.

Referring to FIG. 5(a), the portions 51, 52 and 53 are respectively a p type silicon (Si) substrate, a buried silicon dioxide ($SiO_2$) layer and a region of the substrate in which elements are scheduled to be produced (an element fabrication region). The portions 54 and 55 are respectively a silicon dioxide ($SiO_2$) layer and a polycrystalline silicon (Si) layer. Referring to the figure, a molybdenum silicide ($MoSi_2$) layer 56 having the thickness of 3,000 Å is produced on the patterned polycrystalline silicon (Si) layer 55 and the remaining portion of the silicon dioxide ($SiO_2$) layer 54. Thereafter, a photoresist pattern 57 which corresponds to those of the gates and some of the wiring, is produced on the molybdenum silicide ($MoSi_2$) layer 56. Since the requirements for a material of the metal layer which is to be the wiring is chemical stability and a low electrical resistance, any of the materials noted above as the materials for the thermal strain absorbing layer are satisfactory as a material for the foregoing metal layer.

Figure 5B:
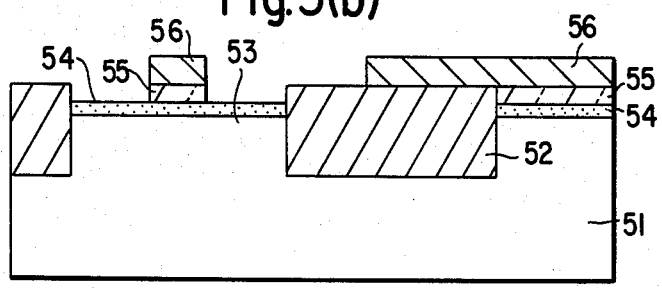

Referring to FIG. 5(b), the photoresist pattern 57 functions as a mask for a dry etching process which is applied to the substrate. A carbon fluoride ($CF_4$) gas containing oxygen ($O_2$) of 5% is employed at a pressure of $5 \times 10^{-3}$ Torr. and an etching rate of 200 Å/min. is realized. Since this dry etching process does not proceed into a silicon oxide ($SiO_2$) layer, it is possible to simultaneously pattern the gate electrodes and metal wirings employing a single mask.

Figure 5C:
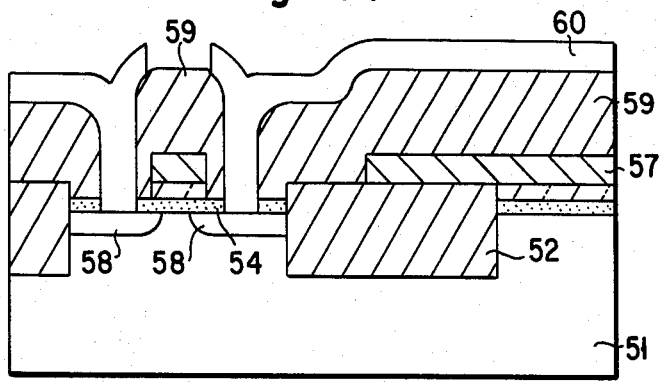

Referring to FIG. 5(c), a series of ordinary steps available in the prior art are employed for production of sources and drains 58, an inter-layer insulating layer 59 and an upper layer wiring 60 for the ultimate purpose of producing a MOS IC. The right portion of FIG. 5(c) shows a cross-sectional view of a MOS transistor, the cross-sectional view showing a cross-section which is parallel to the direction in which the gate electrode extends. In other words, the source and drain (not shown) of the MOS transistor are located in the direction perpendicular to the page.

The foregoing description has described a method for production of a semiconductor device in accordance with the first embodiment which is expanded to a second embodiment, wherein the polycrystalline silicon (Si) layer, which in the first embodiment functioned to absorb thermal strains, is further employed for the production of gate electrodes and/or some of the metal wirings. As a result, in accordance with the present second embodiment, it is possible to simplify the production steps of a method for production of a semiconductor device.

Figure 6:
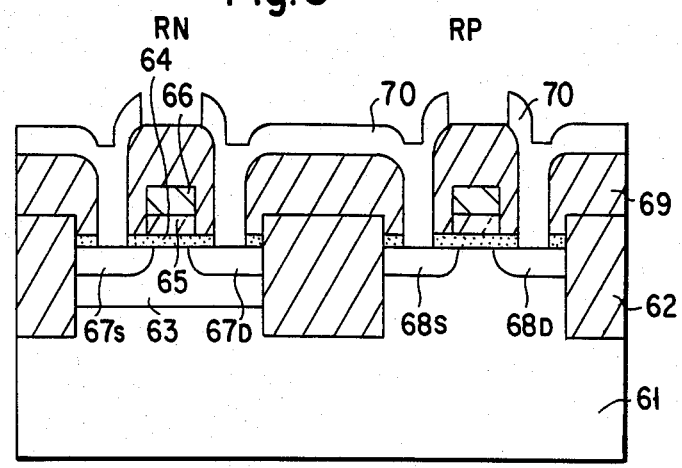
FIG. 6 is a cross-sectional view of a complementary MOS (C-MOS) semiconductor device produced employing a method of production in accordance with a third embodiment of the present invention.

FIG. 6 shows a cross-sectional view of a complementary MOS (C-MOS) semiconductor device produced employing a method for production of a semiconductor device in accordance with the present invention.

Referring to FIG. 6, regions RN and RP respectively show an n-channel type MOS transistor region and a p-channel type MOS transistor region. The portions 61, 62 and 63 are respectively an n type silicon (Si) substrate, a buried silicon dioxide ($SiO_2$) layer and a p-well. The portion 64 is a gate insulating layer produced of silicon dioxide ($SiO_2$). A gate electrode is fabricated with a double layer consisting of a polycrystalline silicon (Si) layer 65 and a molybdenum silicide ($MoSi_2$) layer 66. The portions 67S and 67D respectively are the source region and the drain regions of the n-channel type MOS transistor, and the portions as 68S and 68D respectively are the source region and the drain regions of the p-channel type MOS transistor. The portion 69 is an insulating layer produced of silicon dioxide ($SiO_2$) or phosphosilicate glass, and the portion 70 is a metal wiring layer.

The steps for production of such a C-MOS semiconductor device as is illustrated in FIG. 6 will be described below. The first step is to employ a method available in the prior art to introduce an acceptor impurity into the n type silicon (Si) substrate 61 to produce the p-well region 63, before the silicon dioxide ($SiO_2$) layer 64 and the polycrystalline silicon (Si) layer 65 are grown on the substrate 61.

Some steps which are identical to those which are described with reference to FIG. 4 or FIG. 5 above follow. In other words, the polycrystalline silicon (Si) layer 65 and the silicon dioxide ($SiO_2$) layer 64 are selectively removed by etching processes, and a groove is produced in the substrate 61, before the insulating material ($SiO_2$) 62 is inlayed in the groove. It is essential that at least a part of the groove is produced in the region where the p-n junction separating the p-well 63 and the substrate 61 is exposed to the surface of the substrate 61, so that the p-n junction separating the p-well 63 and the substrate 61 contacts the buried silicon dioxide ($SiO_2$) layer 62 inlayed in the groove.

The next step is to produce the molybdenum silicide ($MoSi_2$) layer 66 on the foregoing polycrystalline silicon (Si) layer 65 and the buried silicon dioxide (SiO₂) layer 62, before a double layer consisting of the molybdenum silicide (MoSi₂) layer 66 and the polycrystalline silicon (Si) layer 65 is selectively removed and the gate electrode and wiring are produced.

The next steps are to introduce a donor impurity and an acceptor impurity respectively to the p-well region and to the substrate 61 respectively, to produce the n+ type source and drain regions 67S and 67D and to produce the p+ type source and drain regions 68S and 68D. During these steps, the gate electrode functions as a mask. Thereafter, the insulating layer 69 is produced, openings are produced for connection of sources, drains and gates, and the metal wiring layer 70 is produced.

Figure 7A:
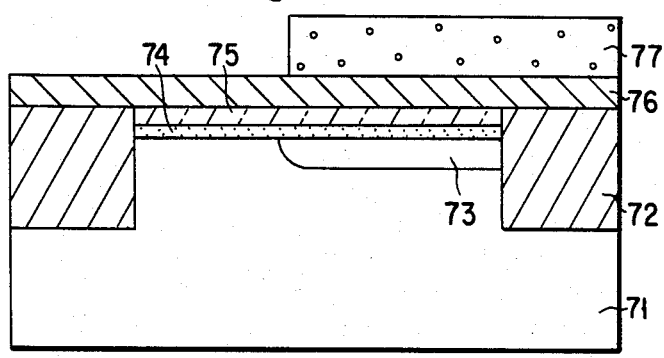
FIGS. 7(a) and 7(b) are cross-sectional views, of which the former and the latter respectively show an intermediate state of and the state after the completion of a process for production of a 1-transistor and 1-capacitor type dynamic random access memory cell in accordance with a fourth embodiment of the present invention.
Figure 7B:
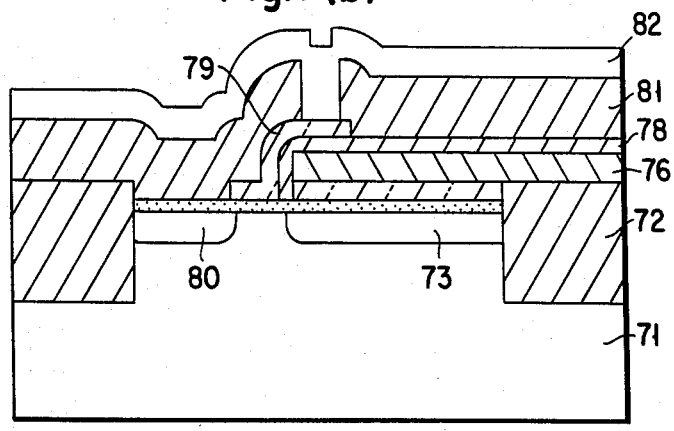

FIGS. 7(a) and 7(b) show a cross-sectional view of a 1-transistor and 1-capacitor type dynamic random access memory (D-RAM) cell produced employing a method for production of a semiconductor device in accordance with the present invention.

The D-RAM cell in accordance with this embodiment is provided with a thermal strain absorbing layer of a polycrystalline silicon (Si) layer which is one of the electrodes of the capacitor and with a silicon dioxide (SiO₂) layer which is interleaved between the thermal strain absorbing layer and a substrate and which functions as a dielectric layer for the capacitor and functions as a gate insulating layer for a MOS transistor which functions as the transfer gate of the D-RAM cell.

Referring to FIG. 7(a), an n+ type region 73 is produced on a selected area of the element fabrication region surrounded by a buried silicon dioxide (SiO₂) layer 72 which is inlayed along the surface of a p type silicon substrate 71. Thereafter, a silicon dioxide (SiO₂) layer 74 and a polycrystalline silicon (Si) layer 75 are produced on the element fabrication region. In the same manner as is in the case of the previous embodiment, the polycrystalline silicon (Si) layer 75 functions as a thermal strain absorbing layer during a process for growing the foregoing buried silicon dioxide (SiO₂) layer 72. The foregoing n+ type region 73 is produced before the silicon dioxide (SiO₂) layer 74 is produced. After a molybdenum silicide (MoSi₂) layer 76 is produced to cover the polycrystalline silicon (Si) layer 75 and the buried silicon dioxide (SiO₂) layer 72, a photoresist layer 77 is produced to selectively cover the molybdenum silicide (MoSi₂) layer 76.

Referring to FIG. 7(b), the next step is to selectively remove the molybdenum silicide (MoSi₂) layer 76 and the polycrystalline silicon (Si) layer 75, employing the photoresist layer 77 as a mask. After the photoresist layer 77 is removed, the surfaces of the molybdenum silicide (MoSi₂) layer 76 and the polycrystalline silicon (Si) layer 75 are oxidized to be converted to an oxide layer 78.

The next step is to produce a polycrystalline silicon (Si) layer 79 which extends along the surfaces of the silicon dioxide (SiO₂) layer 74 and of the oxide layer 78 which is located on the molybdenum silicide (MoSi₂) layer 76, before the polycrystalline silicon (Si) layer 79 is employed as a mask for a process to introduce a donor impurity into the substrate 71 for the purpose of producing an n+ type region 80.

The polycrystalline silicon layer 79 functions as a transfer gate electrode, and the n+ type region 80 functions as a bit line.

Thereafter, an insulating layer 81 is produced, openings are produced for connection of electrodes, and a metal wiring 82, which functions as a word line is produced.

The n+ type region 73 functions as the other of the electrodes of the capacitor. As described earlier, the thermal strain absorbing layer 75 prevents damage in the element fabrication region, thereby decreasing the amount of leakage current in the region which results in the enhancement of the charge holding capacity. As a result, a longer refreshment time can be realized for the memory cell produced by employing the method for production of a semiconductor device in accordance with the present invention.

Figure 8A:
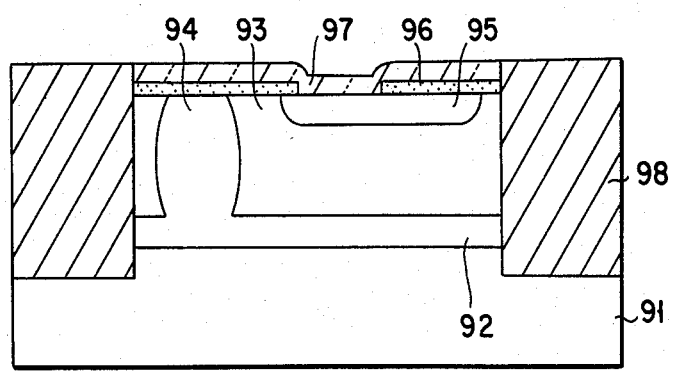
FIGS. 8(a) and 8(b) are cross-sectional views, of which the former and the latter respectively show an intermediate state of and a state after the completion of a process for production of a bipolar type integrated circuit device in accordance with a fifth embodiment of the present invention.
Figure 8B:
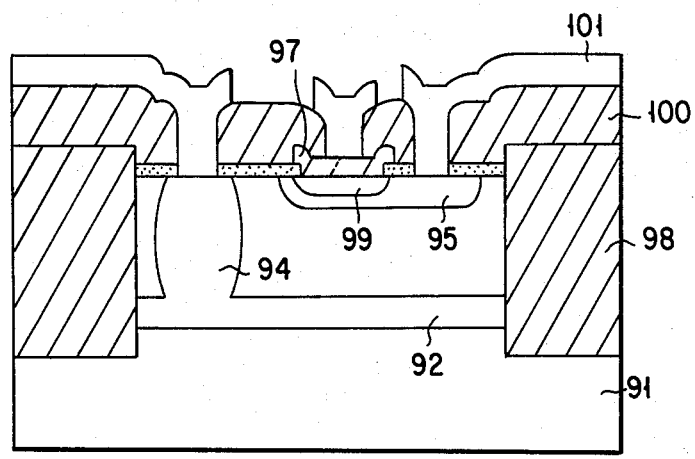

FIGS. 8(a) and 8(b) show cross-sectional views in which FIG. 8(a) shows an intermediate state and FIG. 8(b) shows the state after the completion of a process for production of a bipolar type integrated circuit device in accordance with the one embodiment of the present invention.

The bipolar type integrated circuit device in accordance with this embodiment is provided with a thermal strain absorbing layer of a polycrystalline silicon (Si) layer which also functions as an impurity source for production of an emitter region and/or as an emitter electrode.

Referring to FIG. 8(a), an n+ type collector contact region 94 and a p type base region 95 are produced in an n type silicon (Si) epitaxial layer 93 which is grown on an n+ type buried layer 92 which is further grown on a p type silicon (Si) substrate 91.

Thereafter, a silicon dioxide (SiO₂) layer 96 is produced on the n type silicon (Si) epitaxial layer 93, and an opening for production of an emitter region is produced in the silicon dioxide (SiO₂) layer 96, before a polycrystalline silicon (Si) layer 97 which contains phosphorous (P) is produced to cover the silicon dioxide (SiO₂) layer 96 and the foregoing opening.

The next step is to produce a groove which penetrates the polycrystalline silicon (Si) layer 97 to reach the silicon substrate 91, before employing the process as described earlier to produce a buried silicon dioxide (SiO₂) layer 98.

Referring to FIG. 8(b), an n+ type emitter region 99 is produced during the heat treatment carried out for production of the buried silicon dioxide (SiO₂) layer 98, because phosphorous (P) is diffused from the polycrystalline silicon (Si) layer 97 into a limited portion of the p type base region 95 during the heat treatment.

Thereafter, the polycrystalline silicon (Si) layer 97 is selectively removed, an insulating layer 100 is produced, a window for an electrode is produced, and a metal wiring 101 is produced.

Although the present invention has been described with reference to a specific embodiment, this description is not meant to be construed in a limiting sense. Various modifications of the described embodiments, as well as other embodiments of this invention, will become apparent to persons skilled in the art upon reference to the description of the present invention. It is, therefore, contemplated that the appended claims will cover any such modifications or embodiments as fall within the true scope of this invention.

What is claimed is:

1. A method for producing a semiconductor device having a substrate, element fabrication areas formed in said substrate and dielectric isolation areas surrounding said element fabrication areas, said method comprising:
    (a) forming a thermal strain absorbing layer on the top surface of said element fabrication areas, wherein the material of said thermal strain absorbing layer is a material selected from the group consisting of polycrystalline silicon, molybdenum silicide, tungsten silicide, titanium silicide and tantalum silicide;

(b) forming at least one groove in an area which is to become said isolation areas;

(c) forming by deposition a dielectric insulator on said thermal strain absorbing layer and in said groove; and (d) annealing said insulator to make the density thereof uniform while said thermal strain absorbing layer remains on said top surface.

2. A method for production of a semiconductor device as set forth in claim 1, wherein said insulator is selected from the group consisting of silicon oxide, silicon nitride and aluminum oxide.

3. A method for production of a semiconductor device as set forth in claim 1, wherein the material of said semiconductor substrate is a material selected from the group consisting of silicon, galium-arsenic and indium-phosphorus.

4. A method for production of a semiconductor device as set forth in any one of claims 1, 3 or 4, further comprising:

forming a metal layer on said thermal strain absorbing layer and on said insulator, and removing a portion of said metal layer to form a patterned metal layer corresponding to electrodes and metal wires for said semiconductor device.

5. A method for production of a semiconductor device as set forth in claim 4, wherein the material of said metal layer is a material selected from the group consisting of molybdenum silicide, tungsten silicide, titanium silicide, tantalum silicide and polycrystalline silicon.

6. A method for production of a semiconductor device as set forth in claim 4, including:

(a) forming drain and source regions in at least one of said element fabrication areas; and (b) forming a wiring layer having a predetermined pattern contacting said drain and source regions.

7. A method for production of a semiconductor device as set forth in claim 6, including forming a p-well in a portion of said substrate prior to forming said insulators, wherein the depth of said insulators is greater than the depth of said p-well.

8. A method for production of a semiconductor device as set forth in claim 4, including forming an $n^+$ region in at least one of said element fabrication areas prior to forming said strain absorbing layer.

9. A method for production of a semiconductor device as set forth in claim 5, including:

(a) prior to forming said strain absorbing layer, forming in at least one of said element fabrication areas, an n region, an $n^+$ region and a p region, wherein said n region is between said $n^+$ and said p regions;

(b) after forming said strain absorbing layer and prior to forming said at least one groove, forming an opening in said strain absorbing layer over said n region; and (c) covering said opening and at least a portion of said strain absorbing layer with a layer of polycrystalline silicon containing phosphorous.

* * * * *

UNITED STATES PATENT AND TRADEMARK OFFICE
CERTIFICATE OF CORRECTION

PATENT NO. : 4,506,434
DATED : March 26, 1985
INVENTOR(S) : Tetsuy Ogawa, Machida; Nobuo Toyokura, Kawasaki both of Japan.

It is certified that error appears in the above-identified patent and that said Letters Patent is hereby corrected as shown below:

On the tenth page of subject patent, Column No. 4, Line No. 39, Change "galium-arsenic" to -- gallium arsenic--.

On last page of subject patent, Colum No. 11, Claim No. 3, Line No. 21, Change "galium-arsenic" to -- gallium arsenic--.

Signed and Sealed this

Seventh Day of January 1986

[SEAL]

Attest:

Attesting Officer

DONALD J. QUIGG

Commissioner of Patents and Trademarks